(12) United States Patent
Bae et al.

(10) Patent No.: US 9,679,660 B1
(45) Date of Patent: Jun. 13, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventors: Sung Ho Bae, Seoul (KR); Ji Seon Kim, Seoul (KR); Sung Yong Chung, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/148,123

(22) Filed: May 6, 2016

(51) Int. Cl.
| | | |
|---|---|---|
| *G11C 16/04* | (2006.01) | |
| *G11C 16/26* | (2006.01) | |
| *G11C 16/08* | (2006.01) | |
| *G11C 15/04* | (2006.01) | |

(52) U.S. Cl.
CPC .............. *G11C 16/26* (2013.01); *G11C 15/04* (2013.01); *G11C 16/0483* (2013.01); *G11C 16/08* (2013.01)

(58) Field of Classification Search
CPC ..... G11C 16/26; G11C 16/08; G11C 16/0483; G11C 15/04
USPC ....................................................... 365/185.25
See application file for complete search history.

(56) References Cited

U.S. PATENT DOCUMENTS

| | | | | |
|---|---|---|---|---|
| 8,456,918 B2* | 6/2013 | Oh | ........................ | G11C 16/10 365/185.02 |
| 8,737,140 B2* | 5/2014 | Kim | ...................... | G11C 16/24 365/185.24 |
| 8,923,059 B2* | 12/2014 | Joo | .................... | G11C 16/0483 365/185.02 |
| 9,147,478 B2* | 9/2015 | Park | ...................... | G11C 16/14 |
| 9,159,435 B2* | 10/2015 | Yang | ..................... | G11C 16/26 |

FOREIGN PATENT DOCUMENTS

| | | | |
|---|---|---|---|
| KR | 1020060047935 A | 5/2006 | |
| KR | 1020150001400 A | 1/2015 | |

* cited by examiner

*Primary Examiner* — Pho M Luu
(74) *Attorney, Agent, or Firm* — William Park & Associates Ltd.

(57) ABSTRACT

There are provided a semiconductor memory device having improved reliability and an operating method thereof. A semiconductor memory device includes a memory cell array including a plurality of strings coupled between a bit line and a source line, the plurality of strings including select transistors respectively coupled to select lines and a plurality of memory cells respectively coupled to a plurality of word lines, and a peripheral circuit for performing a read operation on selected memory cells among the plurality of memory cells. The peripheral circuit discharges the select lines earlier than the plurality of word lines in the read operation.

19 Claims, 10 Drawing Sheets

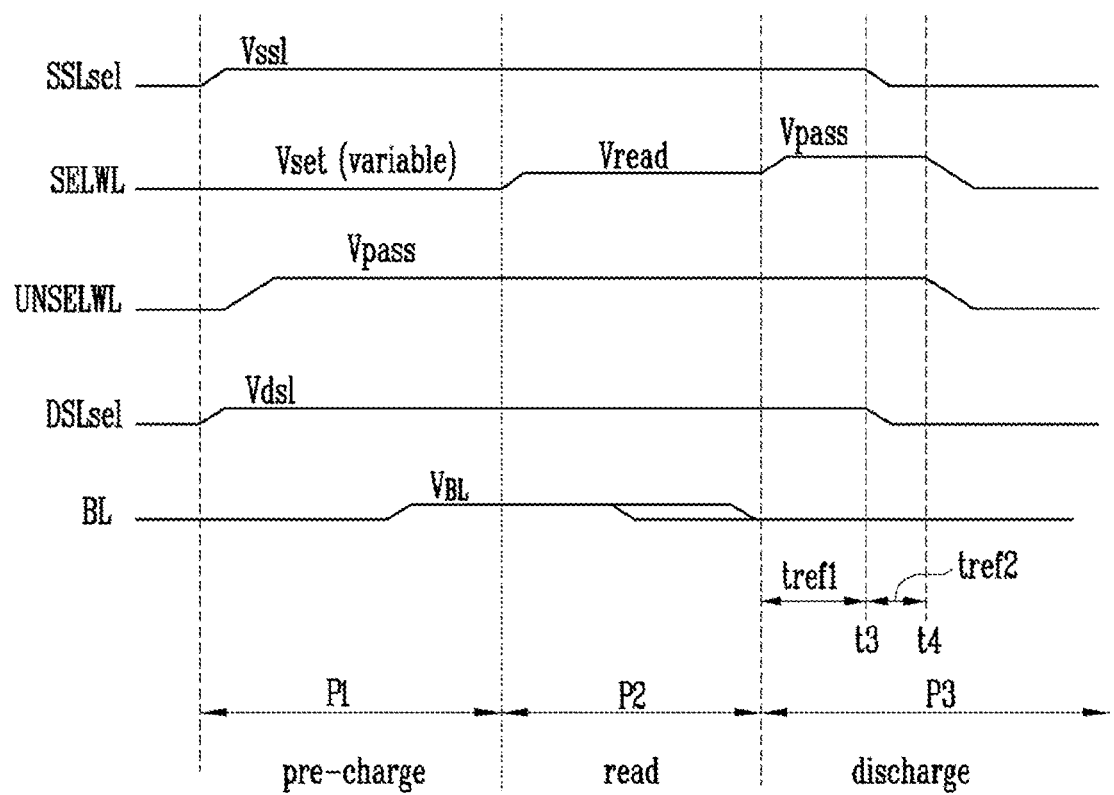

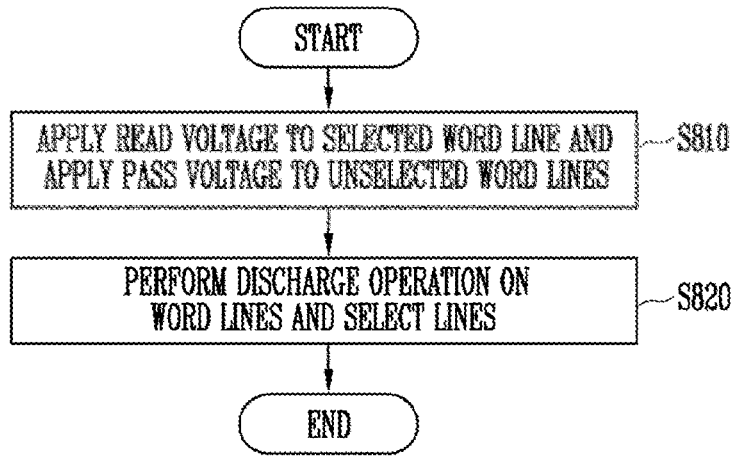
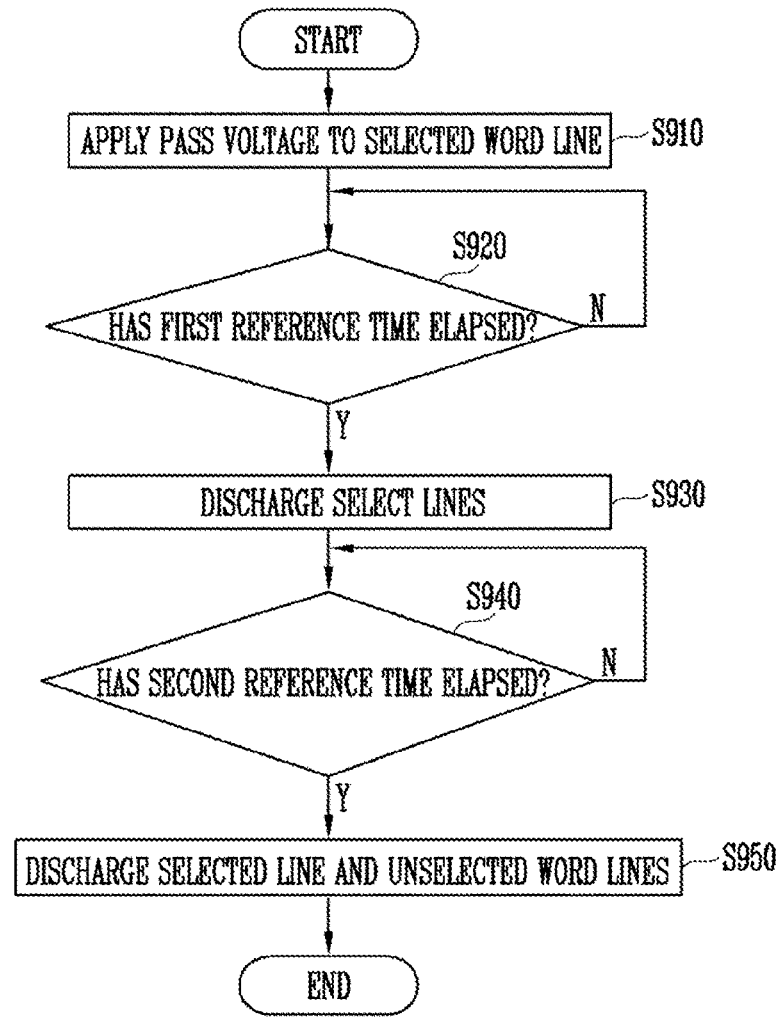

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2016-0012998 filed on Feb. 2, 2016 in the Korean Intellectual Property Office, the entire disclosure of which is incorporated herein by reference.

BACKGROUND

1. Technical Field

An aspect of the present disclosure relates to an electronic device, and more particularly, to a semiconductor memory device and an operating method thereof.

2. Related Art

A semiconductor memory device is a memory device implemented using semiconductor materials such as silicon (Si), germanium (Ge), gallium arsenide (GaAs), and indium phosphide (InP). The semiconductor memory device is generally classified into a volatile memory device and a nonvolatile memory device.

The volatile memory is a memory device that only retains its data while it is powered. Examples of the volatile memory include a static random access memory (SRAM), a dynamic RAM (DRAM), a synchronous DRAM (SDRAM), and the like. The nonvolatile memory may retain its data even in the absence of a power source. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a semiconductor memory device having improved reliability and an operating method thereof.

In an embodiment of the present disclosure, a semiconductor memory device may include a plurality of cell strings coupled between a bit line and a source line, each cell string including select transistors respectively coupled to select lines and a plurality of memory cells respectively coupled to a plurality of word line, the method including. A method of operating semiconductor memory device may include applying a read voltage to a selected word line to which selected memory cells, among the plurality of memory cells, are coupled and applying a pass voltage to unselected word lines to which unselected memory cells, among the plurality of memory cells, are coupled, reading data stored in the selected memory cells, and discharging at least one of the select lines before discharging the selected word line and the unselected word lines.

In an embodiment of the present disclosure, a semiconductor memory device may include a plurality of cell strings coupled between a bit line and a source line, each cell string including select transistors respectively coupled to select lines and a plurality of memory cells respectively coupled to a plurality of word line. A method of operating semiconductor memory device may include applying a pass voltage to a selected word line to which selected memory cells, among the plurality of memory cells, are coupled and to unselected word lines to which unselected memory cells, among the plurality of memory cells, are coupled, if a first reference time elapses after the pass voltage is applied to the selected word line, discharging the select lines, and if a second reference time elapses after the select lines are discharged, discharging the selected word line and the unselected word lines.

In an embodiment of the present disclosure, a semiconductor memory device may include a memory cell array and a peripheral circuit. The memory cell array may include a plurality of cell strings coupled between a bit line and a source line. Each string may include select transistors respectively coupled to select lines and a plurality of memory cells respectively coupled to a plurality of word lines, The peripheral circuit may perform a read operation on selected memory cells among the plurality of memory cells. The peripheral circuit may discharge the select lines before discharging the plurality of word lines in the read operation.

BRIEF DESCRIPTION OF THE DRAWINGS

FIG. 7 is a diagram illustrating an example of an operating method of the semiconductor memory device according to an embodiment of the present disclosure.

FIG. 8 is a flowchart illustrating an example of an operation of the semiconductor memory device according to an embodiment of the present disclosure.

FIG. 9 is a flowchart illustrating an example of a discharge operation of FIG. 8.

DETAILED DESCRIPTION

Figure 1:
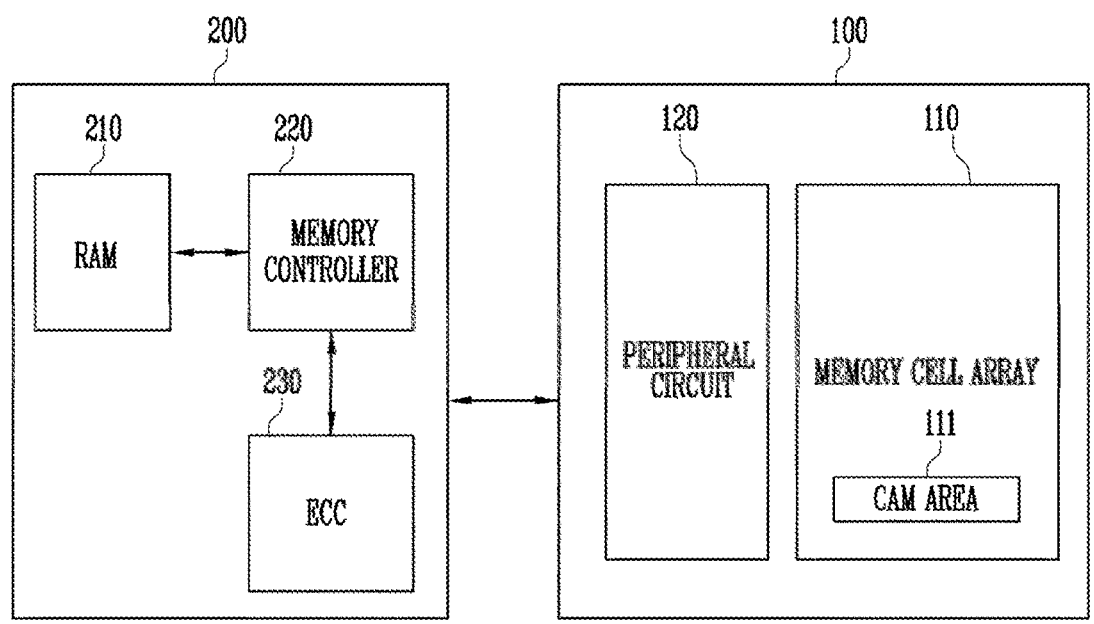
FIG. 1 is a diagram illustrating an example configuration of a memory system.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~between," "immediately ~between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

Hereinafter, various embodiments of the present disclosure will be described in detail with reference to the accompanying drawings.

FIG. 1 is a diagram illustrating an example configuration of a memory system.

Referring to FIG. 1, the memory system 50 may include a semiconductor device 100 and a controller 200.

The semiconductor memory device 100 may be a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. Also, the semiconductor memory device 100 in accordance with an embodiment of the present disclosure may be implemented in a three-dimensional array structure. Various embodiments of the present disclosure may be applied not only to a flash memory device having a conductive floating gate (FG) as a charge storage layer but also to a charge trap flash (CTF) memory having an insulation film as a charge storage layer.

The semiconductor memory device 100 may include a memory cell array 110 and a peripheral circuit 120 for driving the memory cell array 110. The memory cell array 110 may include a plurality of memory cells.

The memory cell array 110 may include a plurality of memory blocks, and the plurality of memory blocks may be divided into a system block, a user block, and the like according to their uses.

In an embodiment, the memory cell array 110 may include a content addressable memory (CAM) area. The CAM area 111 may include a plurality of memory cells included in at least one of the plurality of memory blocks. A memory block corresponding to the CAM area 111 may be a CAM block. The CAM block and the memory block may have the same structure as each other. Setting information of the semiconductor memory device 100 may be stored in the CAM area 111.

For example, information regarding conditions of data input/output operations or other information may be stored in the CAM area 111. In an embodiment, information on a program/erase cycle (P/E cycle), a bad column address, and a bad block address may be stored in the CAM area 111. In an embodiment, optional information required to operate the semiconductor memory device 100, e.g., information on a program voltage, a read voltage, and an erase voltage or information on the thickness of a gate oxide layer of a memory cell, etc. may be stored in the CAM area 111. In an embodiment, repair information may be stored in the CAM area 111. If power is supplied to the semiconductor memory device 100, information stored in the CAM area 111 may be read by the peripheral circuit 120, and the peripheral circuit 120 may control the memory cell array 110 to perform data input/output operations of the memory cells under a condition set according to the read information.

According to an embodiment of the present disclosure, information on a first reference time tref1 and a second reference time tref2, which are required for the semiconductor memory device to discharge a plurality of lines in a read operation, may be stored in the CAM area 111.

The first reference time tref1 may be a time it takes for a voltage level of a selected word line in the semiconductor memory device to reach a pass voltage Vpass.

The second reference time tref2 may be a time it takes for select lines DSL and SSL of the memory cell array in the semiconductor memory device to be discharged. The second reference time tref2 may be a time it takes for voltage levels of the select lines DSL and SSL to reach a ground voltage GND.

The peripheral circuit 120 may operate in response to control signals provided by the controller 200. The peripheral circuit 120 may write (program) data into the memory cell array 110 in response to control signals of the controller 200. The peripheral circuit 120 may operate to read data from the memory cell array 110 and to erase data from the memory cell array 110.

In various embodiments, read and program operations of the semiconductor memory device 100 may be performed on a page basis. An erase operation of the semiconductor memory device 100 may be performed on a block basis.

In the program operation, the peripheral circuit 120 may receive, from the controller 200, a command indicating the program operation, a physical block address (PBA), and data to be written. If one page included in one memory block is selected by the PBA, the peripheral circuit 120 may write (program) data into the selected page.

In the read operation, the peripheral circuit 120 may receive, from the controller 200, a command indicating the read operation (hereinafter, referred to as a "read command") and a PBA. The peripheral circuit 120 may read data from one page included in one memory block, which are selected by the PBA, and may output the read data (hereinafter, referred to as "page data") to the controller 200.

In the erase operation, the peripheral circuit 120 may receive, from the controller 200, a command indicating the erase operation and a PBA. A particular PBA may correspond to one memory block. The peripheral circuit 120 may erase data from a memory block corresponding to the PBA.

The controller 200 may control overall operations of the semiconductor memory device 100. The controller 200 may access the semiconductor memory device 100 in response to a request from an external host. The controller 200 may provide command signals to the semiconductor memory device 100 in response to a request from the external host.

In an embodiment, the controller 200 may control the semiconductor memory device 100 to perform a program, read, or erase operation. In the program operation, the controller 200 may provide the semiconductor memory device 100 with a program command, an address, and data through a channel. In the read operation, the controller 200 may provide the semiconductor memory device 100 with a read command and an address through the channel. In the erase operation, the controller 200 may provide the semiconductor memory device 100 with an erase command and an address through the channel.

The controller 200 may include a read access memory (RAM) 210, a memory controller 220, and an error correction circuit (ECC) 230.

The RAM 210 may operate under control of the memory controller 220, and may be used as a work memory, a buffer memory, a cache memory, or the like. When the RAM 210 is used as a work memory, data processed by the memory controller 220 may be temporarily stored in the RAM 210. When the RAM 210 is used as a buffer memory, the RAM 210 may buffer data to be transmitted from a host (not illustrated) to the semiconductor memory device 100 or data to be transmitted from the semiconductor memory device 100 to the host (not illustrated).

The memory controller 220 may control read, program, erase, and background operations of the semiconductor memory device 100. The memory controller 220 may drive firmware for controlling the semiconductor memory device 100.

The memory controller 220 may convert a logical block address (LBA) provided by the host into a PBA through a flash translation layer (FTL). For example, the FTL may receive an LBA using a mapping table to convert the LBA into a PBA. The PBA may be a page number that can be used to access a specific word line of the memory cell array 110. There are various address mapping methods that may be used for the FTL according to mapping units. Examples of address mapping methods may include a page mapping method, a block mapping method, and a hybrid mapping method.

The ECC 230 may add a parity bit as an error correction code to data. In the read operation, the ECC 230 may correct an error in the page data by using the parity bit. The ECC 230 may correct an error by using a coded modulation scheme including low density parity check (LDPC) code, Bose, Chaudhuri, and Hocquenghem (BCH) code, turbo code, Reed-Solomon code, convolution code, recursive systematic code (RSC), trellis-coded modulation (TCM), block coded modulation, Hamming code, etc.

In the read operation, the ECC 230 may correct an error in the page data. When the number of erroneous bits in the page data exceeds a threshold number of correctable bits, decoding may fail. When the number of erroneous bits in the page data is equal to or smaller than the threshold number of correctable bits, the decoding may succeed.

The success in the decoding represents that a corresponding read command has been performed successfully. The failure in the decoding represents that the corresponding read command has not been performed successfully. When the decoding succeeds, the controller 200 outputs, to the host, page data of which error has been corrected.

Although not illustrated, the controller 200 may further include a memory interface for communicating with the semiconductor memory device 100. The memory interface may include a protocol for communicating with the semiconductor memory device 100. For example, the memory interface may include at least one of flash interfaces such as a NAND interface and a NOR interface.

The controller 200 may further include a host interface for performing data exchange between the host and the controller 200. The host interface may include a protocol for communicating between the host and the controller 200. In an embodiment, the controller 200 may communicate with an external device (e.g., host) through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

Figure 2:
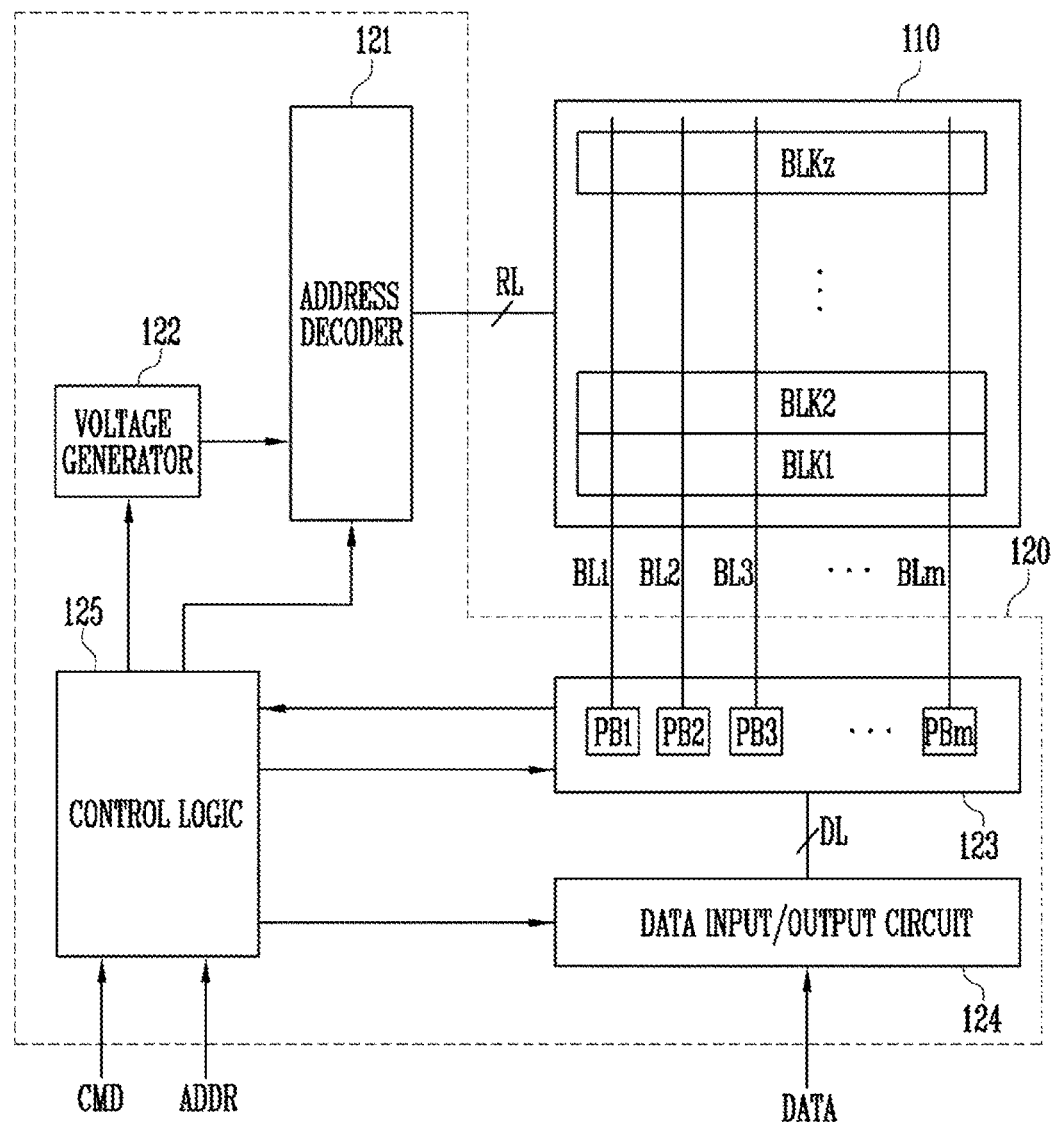
FIG. 2 is a diagram illustrating an example of a semiconductor memory device according to an embodiment of the present disclosure.

FIG. 2 is a diagram illustrating an example of a semiconductor memory device according to an embodiment of the present disclosure.

Figure 3:
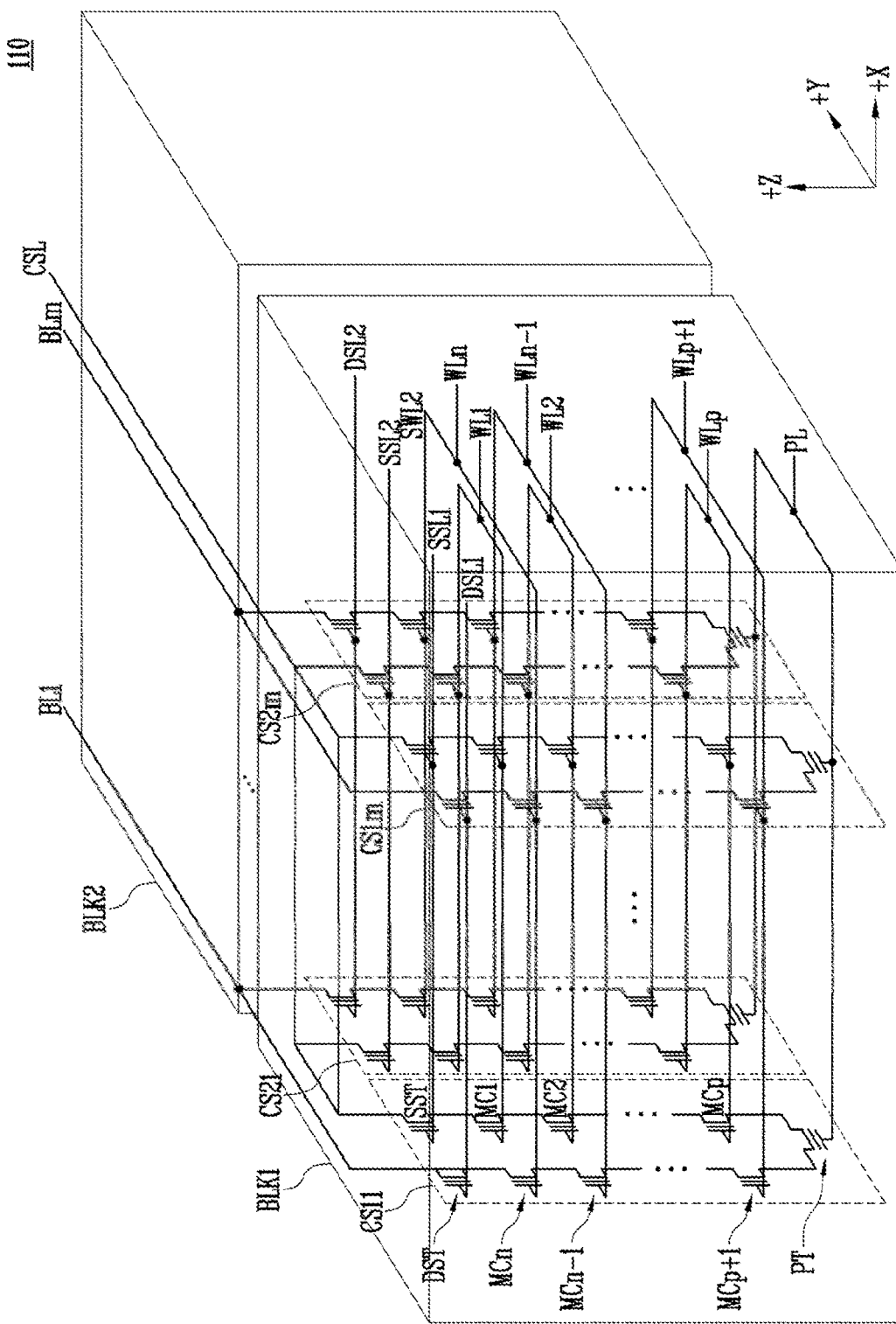
FIG. 3 is a diagram illustrating an example structure of a memory cell array of FIG. 2.

FIG. 3 is a diagram illustrating an example structure of a memory cell array of FIG. 2.

Referring to FIG. 2, the semiconductor memory device 100 may include a memory cell array 100 and a peripheral circuit 120.

The memory cell array 110 may include a plurality of memory blocks BLK0 to BLKz. The plurality of memory blocks BLK0 to BLKz may be coupled to an address decoder 121 through row lines RL, and may be coupled to a read/write circuit 123 through bit lines BL1 to BLm. Each of the plurality of memory blocks BLK0 to BLKz may include a plurality of memory cells. In an embodiment, the plurality of memory cells may be nonvolatile memory cells.

The plurality of memory cells included in the memory cell array 110 may be divided into a plurality of blocks according to their uses.

In an embodiment, the memory cell array 100 may include the CAM area 111 of FIG. 1. The CAM area 111 may include a plurality of memory cells included in at least one memory block. A memory block corresponding to the CAM area 111 may be a CAM block. The CAM block may be at least one block among the memory blocks BLK1 to BLKz. The CAM block may have the same structure as the memory blocks. Setting information of the semiconductor memory device 100 may be stored in the CAM area 111. For example, information regarding conditions of data input/output operations or other information may be stored in the CAM area 111. In an embodiment, information on a program/erase cycle (P/E cycle), a bad column address, and a bad block address may be stored in the CAM area 111. In an embodiment, optional information required to operate the semiconductor memory device 100, e.g., information on a program voltage, a read voltage, and an erase voltage or information on the thickness of a gate oxide layer of a memory cell, etc. may be stored in the CAM area 111. In an embodiment, repair information may be stored in the CAM area 111.

According to an embodiment of the present disclosure, information on a first reference time tref1 and a second reference time tref2, which are required for the semiconductor memory device to discharge a plurality of lines in a read operation, may be stored in the CAM area 111.

The first reference time tref1 may be a time it takes for a voltage level of a selected word line in the semiconductor memory device to reach a pass voltage Vpass.

The second reference time tref2 may be a time it takes for select lines DSL and SSL of the memory cell array in the semiconductor memory device to be discharged. The second reference time tref2 may be a time it takes for voltage levels of the select lines DSL and SSL to reach a ground voltage GND.

First to $z^{th}$ memory blocks BLK1 to BLKz are commonly coupled to first to $m^{th}$ bit lines BL1 to BLm. The first to $z^{th}$ memory blocks BLK1 to BLKz include a plurality of cell strings. The plurality of cell strings are coupled to the first to $m^{th}$ bit lines BL1 to BLm, respectively.

For convenience purposes only, components included in the first memory block BLK1, among the plurality of memory blocks BLK1 to BLKz, are illustrated in FIG. 3, and components included in the other memory blocks BLK2 to BLKz are omitted. It will be understood that each of the other memory blocks BLK2 to BLKz may be configured identically to the first memory block BLK1.

The memory block BLK1 may include a plurality of cell strings CS11 to CS1$m$ and CS21 to CS2$m$. First to $m^{th}$ cell strings CS11 to CS1$m$ may be coupled to the first to $m^{th}$ bit lines BL1 to BLm, respectively.

Each of the first to $m^{th}$ cell strings CS11 to CS1$m$ may include a drain select transistor DST, a plurality of memory cells MC1 to MCn coupled in series, and a source select transistor SST. The drain select transistor DST may be coupled to a drain select line DSL1. First to $n^{th}$ memory cells MC1 to MCn may be coupled to first to $n^{th}$ word lines WL1 to WLn, respectively. The source select transistor SST may be coupled to a source select line SSL1. A drain of the drain select transistor DST may be coupled to a corresponding bit line. The drain select transistors of the first to $m^{th}$ cell strings CS11 to CS1$m$ may be coupled to the first to $m^{th}$ bit lines BL1 to BLm, respectively. A source of the source select transistor SST may be coupled to a common source line CSL. In an embodiment, the common source line CSL may be coupled in common to the first to $z^{th}$ memory blocks BLK1 to BLKz.

Although not illustrated in FIG. 2, the row lines RL may include the drain select line DSL1, the first to $n^{th}$ word lines WL1 to WLn, and the source select line SSL1. The drain select line DSL1, the first to $n^{th}$ word lines WL1 to WLn, and the source select line SSL1 may be controlled by an address decoder 121. The common source line CSL may be controlled by a control logic 125. The first to $m^{th}$ bit lines BL1 to BLm may be controlled by a read/write circuit 123.

Referring back to FIG. 2, the peripheral circuit 120 may include the address decoder 121, a voltage generator 122, the read/write circuit 123, a data input/output circuit 124, and the control logic 125. The address decoder 121 may be coupled to the memory cell array 110 through the row lines RL. The address decoder 121 may operate in response to control signals of the control logic 125. The address decoder 121 may receive an address ADDR through the control logic 125.

In an embodiment, program and read operations of the semiconductor memory device 100 may be performed on a page basis. In the program and read operations, the address ADDR may include a block address and a row address.

The address decoder 121 may decode the block address in the received address ADDR. The address decoder 121 may select one of the memory blocks BLK1 to BLKz according to the decoded block address.

The address decoder 121 may decode the received address ADDR to extract the row address. The address decoder 121 may select one word line of the selected memory block by applying voltages provided from the voltage generator 122 according to the decoded row address.

In the program operation, the address decoder 121 may apply a program voltage to a selected word line and apply a pass voltage lower than the program voltage to unselected word lines. In a program verification operation, the address decoder 121 may apply a verification voltage to a selected word line and apply a verification pass voltage higher than the verification voltage to unselected word lines.

In the read operation, the address decoder 121 may apply a read voltage to a selected word line and apply a pass voltage higher than the read voltage to unselected word lines.

In an embodiment, an erase operation of the semiconductor memory device 100 may be performed on a block basis. In the erase operation, the address ADDR includes a block address. The address decoder 121 may decode the address ADDR to extract the block address and select one memory block according to the decoded block address.

In an embodiment, the address decoder 121 may include a block decoder, a word line decoder, an address buffer, and the like.

The voltage generator 122 may generate a plurality of voltages by using an external power voltage supplied to the semiconductor memory device 100. The voltage generator 122 may operate in response to control signals of the control logic 125.

In an embodiment, the voltage generator 122 may generate an internal power voltage by regulating the external power voltage. The internal power voltage generated by the voltage generator 122 may be used as an operation voltage of the semiconductor memory device 100.

In an embodiment, the voltage generator 122 may generate a plurality of voltages by using the external power voltage or the internal power voltage. For example, the voltage generator 122 may include a plurality of pumping capacitors for receiving the internal power voltage, and may generate a plurality of voltages by selectively activating the plurality of pumping capacitors in response to control signals of the control logic 125. The plurality of generated voltages may be applied to selected word lines by the address decoder 121.

The read/write circuit 123 may include a first to m$^{th}$ page buffers PB1 to PBm. The first to m$^{th}$ page buffers PB1 to PBm may be coupled to the memory cell array 110 through the respective first to m$^{th}$ bit lines BL1 to BLm. The first to m$^{th}$ page buffers PB1 to PBm may operate in response to control signals of the control logic 125.

The first to m$^{th}$ page buffers PB1 to PBm may communicate with the data input/output circuit 124. For example, the first to m$^{th}$ page buffers PB1 to PBm may exchange data with the data input/output circuit 124. In the program operation, the first to m$^{th}$ page buffers PB1 to PBm may receive data DATA to be stored through the data input/output circuit 124 and data lines DL.

In the program operation, the first to m$^{th}$ page buffers PB1 to PBm may transmit, to selected memory cells, the data DATA to be stored, which is received through the data input/output circuit 124, when a program pulse is applied to a selected word line. The memory cells of the selected page may be programmed according to the transmitted data DATA. For example, a threshold voltage of a memory cell coupled to a bit line receiving a program permission voltage (e.g., a ground voltage) may increase. The threshold voltage of a memory cell coupled to a bit line receiving a program prohibition voltage (e.g., a power voltage) may be maintained. In a program verify operation, the first to m$^{th}$ page buffers PB1 to PBm may read page data from the selected memory cells through the bit lines BL1 to BLm.

In the read operation, the read/write circuit 123 may read data DATA from memory cells of a selected page through the bit lines BL and output the read data DATA to the data input/output circuit 124.

In the erase operation, the read/write circuit 123 may make the bit lines BL floating.

The data input/output circuit 124 may be coupled to the first to m$^{th}$ page buffers PB1 to PBm through the data lines DL. The data input/output circuit 124 may operate in response to control signals of the control logic 125. In the program operation, the data input/output circuit 124 may receive data DATA to be stored from an external controller (not illustrated).

In the read operation, the data input/output circuit 124 may output, to the external controller, data transmitted from the first to m$^{th}$ page buffers PB1 to PBm included in the read/write circuit 123.

The control logic 125 may be coupled to the address decoder 121, the voltage generator 122, the read/write circuit 123, and the data input/output circuit 124. The control logic 125 may control overall operations of the semiconductor memory device 100. The control logic 125 may receive a command CMD and an address ADDR from the external controller. The control logic 125 may control the address decoder 121, the voltage generator 122, the read/write circuit 123, and the data input/output circuit 124 in response to the command CMD. The control logic 125 may transmit the address ADDR to the address decoder 121.

According to an embodiment of the present disclosure, if power is supplied to the semiconductor memory device 100, the control logic 125 can read information stored in the CAM area 111.

In an embodiment of the present disclosure, the control logic 125 can discharge the word lines and the select lines according to the first and second reference times tref1 and tref2 read from the CAM area 111.

In the read operation, the control logic 125 may control the voltage generator 122 and the address decoder 121 to apply the pass voltage Vpass to a selected word line in a discharge period.

If the first reference time tref1 elapses after the pass voltage Vpass is applied to the selected word line, the control logic 125 may discharge the selected lines DSL and SSL. If the first reference time tref1 elapses, the control logic 125 may control the voltage generator 122 and the address decoder 121 to apply the ground voltage to the select lines DSL and SSL.

If the second reference time tref2 elapses after the ground voltage is applied to the select lines DSL and SSL, the control logic 125 may discharge the word lines of the memory cell array 110. If the second reference time tref2 elapses, the control logic 125 may control the voltage generator 122 and the address decoder 121 to apply the ground voltage to the word lines so as to discharge the word lines.

The control logic 125 may include at least one counter circuit for determining whether the first reference time tref1 and the second reference time tref2 have elapsed.

Figure 4:
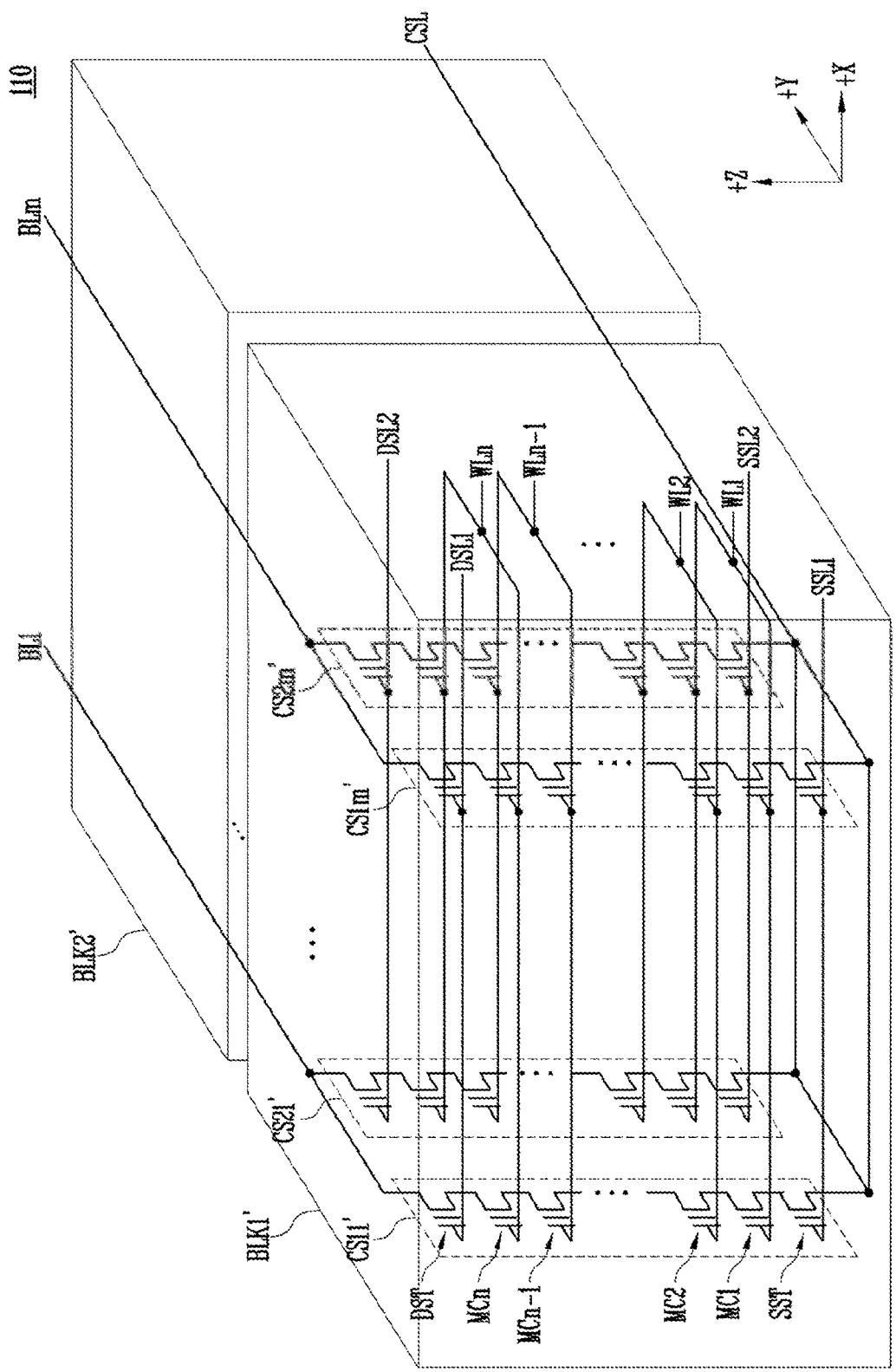
FIG. 4 is a diagram illustrating an example of the memory cell array of FIG. 2.

Referring back to FIG. 3, the first memory block BLK1 may include a plurality of cell strings CS11 to CS1m and CS21 to CS2m. In an embodiment, each of the plurality of cell strings CS11 to CS1m and CS21 to CS2m may have a 'U' shape. In the first memory block BLK1, m cell strings are arranged in a row direction (e.g., a +X direction). Although it is illustrated in FIG. 4 for convenience purposes that two cell strings are arranged in a column direction (e.g., a +Y direction), it will be understood that three or more cell strings may be arranged in the column direction.

Each of the plurality of cell strings CS11 to CS1m and CS21 to CS2m may include at least one source select transistor SST, first to n$^{th}$ memory cells MC1 to MCn, a pipe transistor PT, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string may be coupled between a common source line CSL and memory cells MC1 to MCp.

In an embodiment, source select transistors of cell strings arranged in the same row may be coupled to a source select line extending in the row direction, and source select transistors of cell strings arranged in different rows may be coupled to different source select lines. In FIG. 3, source select transistors of cell strings CS11 to CS1m in a first row may be coupled to a first source select line SSL1. Source select transistors of cell strings CS21 to CS2m in a second row may be coupled to a second source select line 55L2.

In an embodiment, the source select transistors of the cell strings CS11 to CS1m and CS21 to CS2m may be coupled in common to one source select line.

The first to n$^{th}$ memory cells MC1 to MCn of each cell string may be coupled between the source select transistor SST and the drain select transistor DST.

The first to n$^{th}$ memory cells MC1 to MCn may be divided into two or more groups, for example, first to p$^{th}$ memory cells MC1 to MCp and (p+1)$^{th}$ to n$^{th}$ memory cells MCp+1 to MCn. The first to p$^{th}$ memory cells MC1 to MCp are sequentially arranged in a direction opposite to a +Z direction, and are coupled in series between the source select transistor SST and the pipe transistor PT. The $(p+1)^{th}$ to $n^{th}$ memory cells MCp+1 to MCn may be sequentially arranged in the +Z direction, and may be coupled in series between the pipe transistor PT and the drain select transistor DST. The first to $p^{th}$ memory cells MC1 to MCp and the $(p+1)^{th}$ to $n^{th}$ memory cells MCp+1 to MCn may be coupled to each other through the pipe transistor PT. Gates of the first to $n^{th}$ memory cells MC1 to MCn of each cell string may be coupled to first to $n^{th}$ word lines WL1 to WLn, respectively.

In an embodiment, at least one of the first to $n^{th}$ memory cells MC1 to MCn may be used as a dummy memory cell. When the dummy memory cell is provided, the voltage or current of a corresponding cell string may remain stable. Accordingly, it is possible to improve the reliability of data stored in the memory block BLK1.

A gate of the pipe transistor PT of each cell string may be coupled to a pipe line PL.

The drain select transistor DST of each cell string may be coupled between a corresponding bit line and the memory cells MCp+1 to MCn. The cell strings arranged in the row direction may be coupled to a drain select line extending in the row direction. The drain select transistors of the cell strings CS11 to CS1m in the first row may be coupled to a first drain select line DSL1. The drain select transistors of the cell strings CS21 to CS2m in the second row may be coupled to a second drain select line DSL2.

Cell strings arranged in the column direction may be coupled to a bit line extending in the column direction. In FIG. 3, the cell strings CS11 and CS21 in a first column may be coupled to a first bit line BL1. The $m^{th}$ cell strings CS1m and CS2m are coupled to an $m^{th}$ bit line BLm.

Memory cells coupled to the same word line, among memory cells of cell strings arranged in the row direction, may constitute one page. For example, memory cells coupled to a first word line WL1, among memory cells of the cell strings CS11 to CS1m arranged in the first row, may constitute one page, and memory cells coupled to the first word line WL1, among memory cells of the cell strings CS21 to CS2m arranged in the second row, may constitute another page. As one of the drain select lines DSL1 and DSL2 is selected, cell strings arranged in one row direction can be selected. As one of the word lines WL1 to WLn is selected, one page in the selected cell strings can be selected.

FIG. 4 is a diagram illustrating an example of the memory cell array of FIG. 2.

Referring to FIG. 4, the memory cell array 110 may include a plurality of memory cells BLK1' to BLKz'. In FIG. 4, for convenience purposes, only a part of the plurality of memory cells BLK1' to BLKz (i.e., an internal configuration of a first memory block BLK1') is illustrated, and thus internal configurations of the other memory blocks BLK2' to BLKz' are omitted. It will be understood that second to $z^{th}$ memory blocks BLK2' to BLKz' may also be configured identically to the first memory block BLK1'.

The first memory block BLK1' may include a plurality of cell strings CS11' to CS1m' and CS21' to CS2m'. Each of the plurality of cell strings CS11' to CS1m' and CS21' to CS2m' may extend along the +Z direction. In the first memory block BLK1', m cell strings may be arranged in the +X direction. Although it is illustrated in FIG. 4 that two cell strings are arranged in the +Y direction, it will be understood that three or more cell strings may be arranged in the column direction.

Each of the plurality of cell strings CS11' to CS1m' and CS21' to CS2m' may include at least one source select transistor SST, first to $n^{th}$ memory cells MC1 to MCn, and at least one drain select transistor DST.

The source select transistor SST of each cell string may be coupled between a common source line CSL and the memory cells MC1 to MCn. Source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line 55L2. In an embodiment, the source select transistors of the cell strings CS11' to CS1m' and CS21' to CS2m' may be coupled in common to one source select line.

The first to $n^{th}$ memory cells MC1 to MCn of each cell string may be coupled in series between the source select transistor SST and the drain select transistor DST. Gates of the first to $n^{th}$ memory cells MC1 to MCn may be coupled to first to $n^{th}$ word lines WL1 to WLn, respectively.

In an embodiment, at least one of the first to $n^{th}$ memory cells MC1 to MCn may be used as a dummy memory cell. When the dummy memory cell is provided, the voltage or current of a corresponding cell string may remain stable. Accordingly, it is possible to improve the reliability of data stored in the memory block BLK1'.

The drain select transistor DST of each cell string may be coupled between a corresponding bit line and the memory cells MC1 to MCn. The drain select transistors of the cell strings in the row direction may be coupled to a drain select line extending in the row direction. The drain select transistors of the cell strings CS11' to CS1m' in the first row may be coupled to a first drain select line DSL1. The drain select transistors of the cell strings CS21' to CS2m' in the second row may be coupled to a second drain select line DSL2.

Consequently, the memory block BLK1' of FIG. 4 may have an equivalent circuit similar to the memory block BLK1 of FIG. 3, except that the pipe transistor PT is excluded from each cell string.

Figure 5:
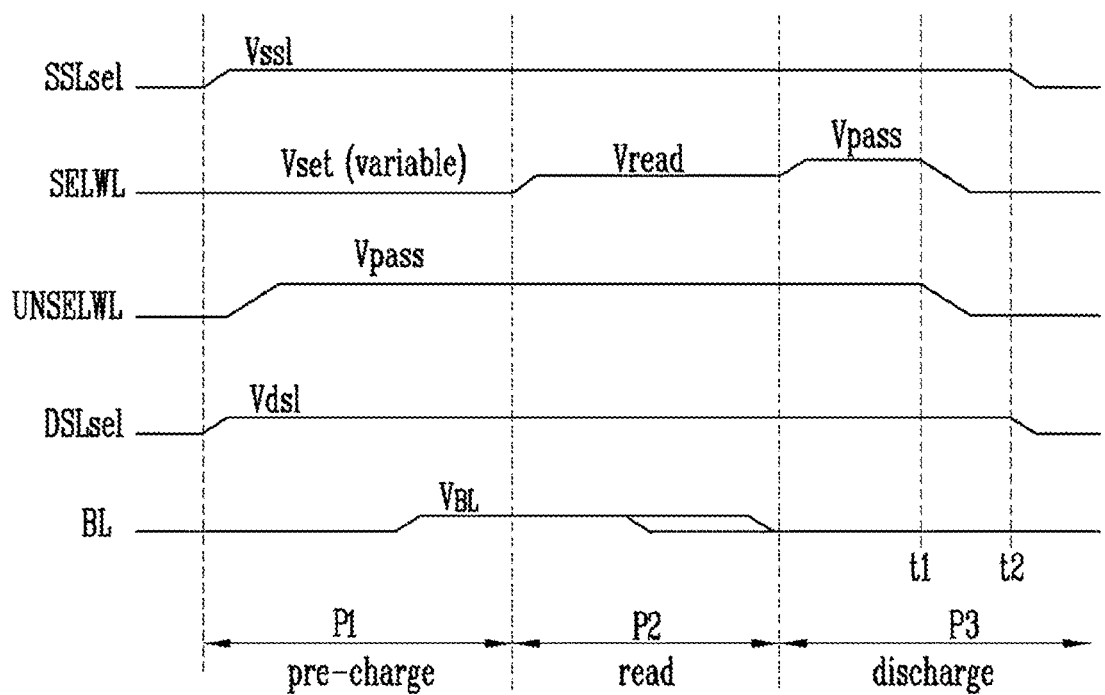
FIG. 5 is a diagram illustrating examples of voltages applied to each line in a read operation.

FIG. 5 is a diagram illustrating examples of voltages applied to each line in a read operation.

Figure 6:
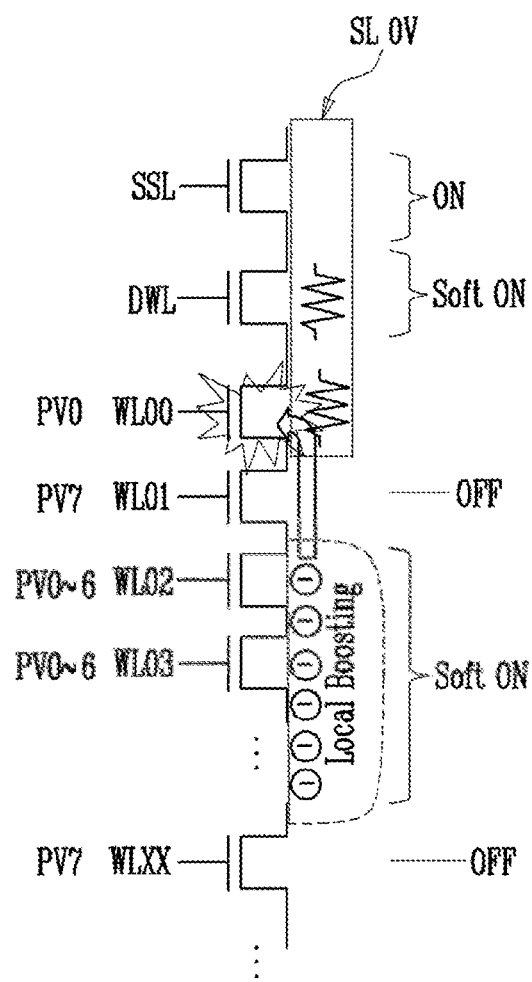
FIG. 6 is a diagram illustrating a phenomenon occurring when the voltage of FIG. 5 is applied.

FIG. 6 is a diagram illustrating a phenomenon occurring when the voltage of FIG. 5 is applied.

A read operation of the semiconductor memory device may include an operation of accessing an address of a memory cell and then sensing a status of the memory cell. The read operation may include an operation of sensing, for example, whether the memory cell is in a program state or erasure state and what the threshold voltage of the memory cell is. Examples of the read operation may include program verification and erase verification accompanied with program and erase operations. Thus, a verification operation according to an embodiment of the present disclosure is applicable to a program verification operation and an erase verification operation.

Referring to FIG. 5, the read operation of the semiconductor memory device may be generally divided into a pre-charge period P1, a read period P2, and a discharge period P3.

In the pre-charge period P1, the semiconductor memory device may apply preset voltages so as to perform the read operation on each line coupled to the memory cell array.

A source select voltage Vssl and a drain select voltage Vdsl are respectively applied to a source select line SSLsel and a drain select line DSLsel, which are selected in the pre-charge period P1. The source select voltage Vssl and the drain select voltage Vdsl respectively turn on a source select transistor and a drain select transistor, which are included in a selected memory string.

A word line setting voltage Vset may be applied to a selected word line SELWL. Here, the word line setting voltage Vset may have the same voltage level as a pass voltage Vpass applied to unselected word lines UNSELWL. In various embodiments, the word line setting voltage Vset may make the selected word line SELWL floating. The word line setting voltage Vset may be a voltage for setting the selected word line SELWL to a status required in the read operation. In operations of the semiconductor memory device according to an embodiment of the present disclosure, various word line setting voltages may be applied (variable).

The pass voltage Vpass applied to the unselected word lines UNSELWL may be a voltage for turning on memory cells coupled to the unselected word lines UNSELWL.

A bit line voltage VBL may be applied to bit lines BL. The bit line voltage VBL may pre-charge the bit lines BL so as to perform the read operation.

Further descriptions as to operations of sensing a voltage level or current of the bit line BL through a page buffer PB after a pre-charge operation of the bit line BL or an evaluation operation of a memory cell will be omitted.

In the read period P2, data stored in a plurality of memory cells coupled to the selected word line SELWL may be read out by applying a read voltage Vread to the selected word line SELWL.

The voltages applied in the pre-charge period P1 may be maintained in the source select line SSLsel, the drain select line DSLsel, and the unselected word lines UNSELWL during the read period P2.

The read voltage Vread may be applied to the selected word line SELWL.

The potential of the bit line BL may have high voltage, low voltage, or a floating state according to program states of the memory cells coupled to the selected word lines SELWL.

In the discharge period P3, the semiconductor memory device may discharge each line coupled to the memory cell array.

Referring to FIG. 5, the semiconductor memory device may apply the pass voltage Vpass to the selected word line SELWL, thereby equalizing voltage levels of all word lines. In an embodiment, the voltage levels of the word lines may be set to have different values.

At a point in time t1, the semiconductor memory device may discharge the word lines.

Referring to FIG. 6, one memory string may include a source select transistor coupled to a source select line SSL and dummy memory cells coupled in series to the source select transistor, and the dummy memory cells are coupled to dummy word lines DWL, respectively. A plurality of memory cells coupled to the dummy memory cells may be coupled to zero$^{th}$ to XX$^{th}$ word lines WL00 to WLXX, respectively. For convenience purposes only, it is assumed in FIG. 6 that a memory cell coupled to the zero$^{th}$ word line WL00 is in an erased state PV0, and a memory cell coupled to the first word line WL01 is in a seventh programmed state PV7. Memory cells coupled to the second to XX$^{th}$ word lines WL02 to WLXX may have various programmed states.

The word lines may be discharged at the point in time t1 of the discharge period P3. At this time, the source select voltage may be applied to the source select line, and therefore the source select transistor may be turned on. Also, the drain select voltage may be applied to the drain select line, and therefore the drain select transistor may be turned on. A ground voltage GND may be applied to the common source line, the drain select line, and the bit line during the discharge period P3. If the discharging of all word lines is started, the voltage of the word lines may decrease from the pass voltage Vpass to the ground voltage GND.

The on/off state of a channel of each word line may be changed depending on a difference in threshold voltages of the memory cells coupled to the word lines in the discharge period P3.

That is, when the threshold voltage of the memory cell coupled to the zero$^{th}$ word line WL00 is lower than the threshold voltage of the memory cell coupled to the first word line WL01, the channel of the memory cell coupled to the first word line WL01 may reach the 'off' state earlier than the channel of the memory cell coupled to the zero$^{th}$ word line WL00. The channels of memory cells having high threshold voltages may reach the 'off' state earlier than the channels of memory cells having low threshold voltages, and hence the channels of the memory cells having low threshold voltages, which exist within the boundary of the memory cells having high threshold voltages, may be in the floating state during the discharge operation. Therefore, local boosting may occur between channels in the 'off' state.

If the local boosting occurs, hot carrier injection (HCI) toward the channel of the zero$^{th}$ word line WL00 from the channel of the second word line WL02 may occur according to a potential difference of the source line or bit line with the ground voltage GND. Therefore, the threshold voltage of the memory cell coupled to the zero$^{th}$ word line WL00 may be increased even when the memory cell is in the erased state PV0. This may cause read disturbance.

Although it is illustrated in FIG. 6 that the memory string includes one source select transistor, one drain select transistor (not illustrated), and one dummy memory cell, the memory string may include a plurality of source select transistors, a plurality of dummy memory cells, and a plurality of drain select transistors.

FIG. 7 is a diagram illustrating an example of an operating method of the semiconductor memory device according to an embodiment of the present disclosure.

In the embodiment of FIG. 7, operations of the semiconductor memory in a pre-charge period P1 and a read period P2 may be the same as those of FIG. 6.

According to an embodiment of the present disclosure, the semiconductor memory device may discharge the select lines SSL and DSL earlier than the word lines and then discharges the word lines in a discharge period P3.

In the discharge period P3, the semiconductor memory device may apply a pass voltage Vpass to a selected word line SELWL, thereby equalizing voltage levels of all word lines. In various embodiments, the semiconductor memory device may set the voltages of the word lines so that the set voltages are different from each other.

If a first reference time tref1 elapses after the pass voltage Vpass is applied to the selected word line SELWL (t3), the semiconductor memory device discharges the select lines SSLsel and DSLsel. The semiconductor memory device may apply a ground voltage to the select lines SSLsel and DSLsel so as to discharge the select lines SSLsel and DSLsel.

The first reference time tref1 may be a time it takes for the voltage level of the selected word line SELWL to reach the pass voltage Vpass.

In various embodiments, the select lines SSLsel and DSLsel are not simultaneously discharged, but any one of the source select line SSL and the drain select line DSL may be first discharged. Alternatively, the semiconductor memory device does not perform an equalizing operation of changing the voltage of the selected word line SELWL to the pass voltage Vpass, but may immediately discharge the select lines SSLsel and DSLsel in the discharge period P3.

If a second reference time tref2 elapses after discharging the select lines is started (t4), the semiconductor memory device may discharge the word lines. The semiconductor memory device may apply the ground voltage to the selected word line SELWL and the unselected word lines UNSELWL so as to discharge the word lines.

The second reference time tref2 may be a time it takes for the select lines SSLsel and DSLsel to be discharged. That is, the second reference time tref2 may be a timed it takes for the select transistors SST and DST to be turned off.

In various embodiments, the word lines are not simultaneously discharged, but may be sequentially discharged from a word line located far from any one of the source and bit lines. For example, the word lines may be sequentially discharged from a word line farthest from any one of the source and bit lines. Alternatively, the plurality of word lines may be divided into at least one word line group, and the at least one word line groups may be sequentially discharged from a word line group adjacent to any one of the source and bit lines. For example, the at least one word line groups may be sequentially discharged from a word line group closest to any one of the source line and the bit line.

Information on the first reference time tref1 and the second reference time tref2 may be stored in the CAM area of the memory cell array. If power is supplied to the semiconductor memory device, the information on the first reference time tref1 and the second reference time tref2 may be read out from the CAM area, thereby performing a discharge operation according to the embodiment of FIG. 7.

FIG. 8 is a flowchart illustrating an example of an operation of the semiconductor memory device according to an embodiment of the present disclosure.

Referring to FIG. 8, in step S810, the semiconductor memory device may apply a read voltage Vread to a selected word line and apply a pass voltage Vpass to unselected word lines. The semiconductor memory device may perform a read operation on a plurality of memory cells coupled to the selected word line through step S110.

In step S820, the semiconductor memory device may perform a discharge operation on the word lines and select lines. The discharge operation in step S820 will be described in detail with reference to FIG. 9.

FIG. 9 is a flowchart illustrating an example of the discharge operation of FIG. 8.

Referring to FIG. 9, in step S910, the semiconductor memory device may apply the pass voltage Vpass to the selected word line. The semiconductor memory device may equalize voltage levels of all the word lines to the pass voltage Vpass in step S910. In various embodiments, the equalizing process in step S910 may be omitted. When step S910 is omitted, the semiconductor memory device does not perform step S920, and may immediately proceed to S930.

In step S920, the semiconductor memory device may determine whether a first reference time has elapsed. The first reference time may be a time it takes for the voltage level of the selected word line in the semiconductor memory device to reach the pass voltage Vpass.

If it is determined in step S920 that the first reference time has elapsed, the semiconductor memory device may proceed to step S930.

In step S930, the semiconductor memory device may discharge the select lines. The select lines may be a source select line SSL and a drain select line DSL. The semiconductor memory device may apply a ground voltage GND to the select lines so as to discharge the select lines. In various embodiments, the select lines are not simultaneously discharged, and any one of the source select line SSL and the drain select line DSL may be first discharged.

In step S940, the semiconductor memory device may determine whether a second reference time has elapsed. The second reference time may be a time it takes for the select lines DSL and SSL of the memory cell array in the semiconductor memory device to be discharged. The second reference time may be a time it takes for the voltages of the select lines DSL and SSL to reach the ground voltage GND.

If it is determined in step S940 that the second reference time has elapsed, the semiconductor memory device may proceed to step S950.

In step S950, the semiconductor memory device may discharge the selected word line and the unselected word lines.

In various embodiments, the word lines are not simultaneously discharged in step S950, but may be sequentially discharged from a word line located distant from any one of the source and bit lines. For example, the word lines may be sequentially discharged from a word line farthest from any one of the source and bit lines. Alternatively, the plurality of word lines may be divided into at least one word line group, and the at least one word line group may be sequentially discharged from a word line group adjacent to any one of the source and bit lines. For example, the at least one word line groups may be sequentially discharged from a word line group closest to any one of the source line and the bit line.

According to an embodiment of the present disclosure, in the discharge operation of the read or verify operation, the select lines can be discharged earlier than the word lines, and thus it is possible to prevent local boosting due to different program states of the memory cells, thereby preventing, in advance, read disturbance.

Figure 10:
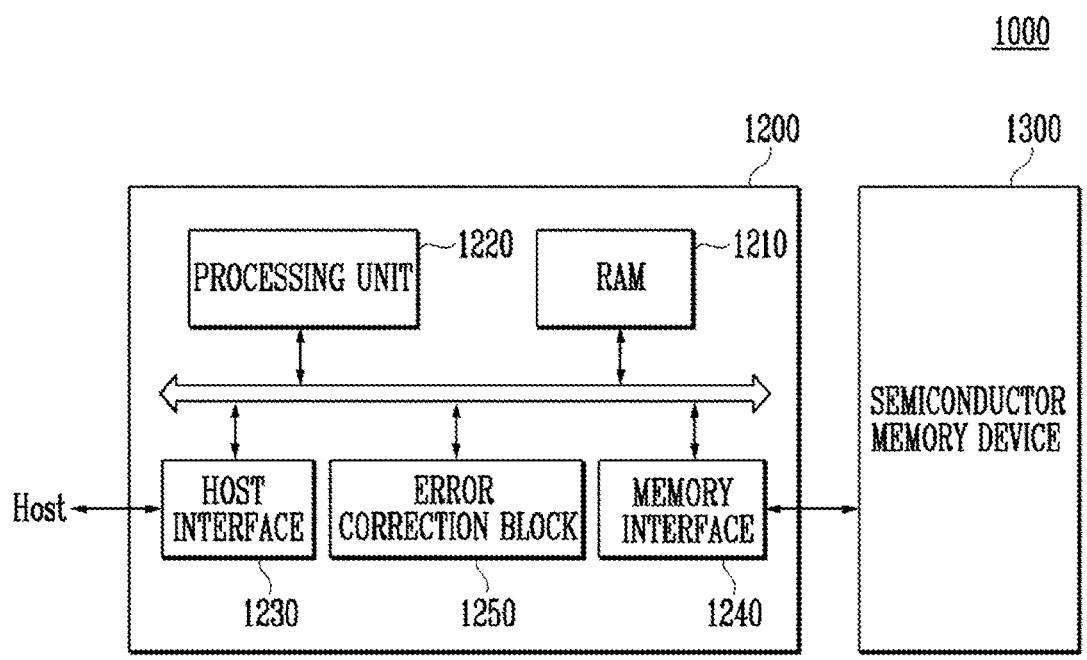
FIG. 10 is a diagram illustrating an example of a memory system including the semiconductor memory device of FIG. 2.

FIG. 10 is a diagram illustrating an example of a memory system including the semiconductor memory device of FIG. 2.

Referring to FIG. 10, the memory system 1000 may include a semiconductor memory device 1300 and a controller 1200.

The semiconductor memory device 1300 may be configured and operated identically to the semiconductor memory device 100 described with reference to FIG. 1. Hereinafter, any repetitive detailed description will be omitted or simplified.

The controller 1200 may be coupled to a host Host and the semiconductor memory device 1300. The controller 1200 may access the semiconductor memory device 1300 in response to a request from the host Host. For example, the controller 1200 may control read, write, erase, and background operations of the semiconductor memory device 1300. The controller 1200 may provide an interface between the semiconductor memory device 1300 and the host Host. The controller 1200 may drive firmware for controlling the semiconductor memory device 1300.

The controller 1200 may include a random access memory (RAM) 1210, a processing unit 1220, a host interface 1230, a memory interface 1240, and an error correction block 1250.

The RAM 1210 may be used as at least one of an operation memory of the processing unit 1220, a cache memory between the semiconductor memory device 1300 and the host Host, and a buffer memory between the semiconductor memory device 1300 and the host Host.

The processing unit 1220 may control overall operations of the controller 1200.

The processing unit 1220 may randomize data received from the host Host. For example, the processing unit 1220 may randomize the data received from the host Host by using a randomizing seed. The randomized data may be provided as data DATA (see FIG. 1) to be stored to the semiconductor memory device 1300 (e.g. to be programmed to the memory cell array 110 of FIG. 1).

The processing unit 1220 may derandomize data received from the semiconductor memory device 1300 when a read operation is performed. For example, the processing unit 1220 may derandomize the data received from the semiconductor memory device 1300 by using a derandomizing seed. The derandomized data may be output to the host Host.

In an embodiment, the processing unit 1220 may perform randomizing and derandomizing by driving software or firmware.

The host interface 1230 may include a protocol for exchanging data between the host Host and the controller 1200. In an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 may interface with the semiconductor memory device 1300. For example, the memory interface 1240 may include a NAND interface or a NOR interface.

The error correction block 1250 may detect/correct an error of data received from the semiconductor memory device 1300 by using an error correction code (ECC).

The controller 1200 and the semiconductor memory device 1300 may be integrated into one semiconductor device. In an embodiment, the controller 1200 and the semiconductor memory device 1300 may be integrated into a memory card. For example, the controller 1200 and the semiconductor memory device 1300 may be integrated into a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 1300 may be integrated into a semiconductor drive (e.g., solid state drive (SSD)). The semiconductor drive (e.g., SSD) may include a storage device that stores data in a semiconductor memory.

In an example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

In an embodiment, the semiconductor memory device 1300 or the memory system 1000 may be packaged in various forms. Examples of the packages may include package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP).

Figure 11:
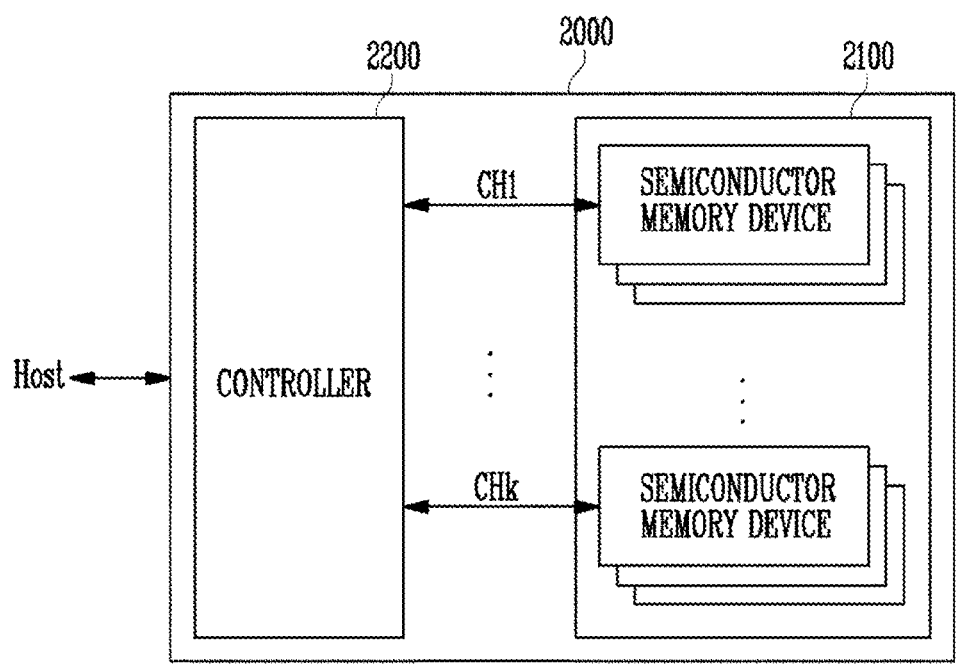
FIG. 11 is a diagram illustrating an application example of the memory system of FIG. 10.

FIG. 11 is a diagram illustrating an application example 2000 of the memory system 1000 of FIG. 10.

Referring to FIG. 11, the memory system 2000 includes a semiconductor memory device 2100 and a controller 2200. The semiconductor memory device 2100 may include a plurality of semiconductor memory chips. The plurality of semiconductor memory chips are divided into a plurality of groups.

In FIG. 11, it is illustrated that the plurality of groups communicate with the controller 2200 through first to $k^{th}$ channels CH1 to CHk. Each semiconductor memory chip may be configured and operated identically to the semiconductor memory device 100 described with reference to FIG. 1.

Each group may communicate with the controller 2200 through one common channel. The controller 2200 may be configured similarly to the controller 1200 described with reference to FIG. 10. The controller 2200 may control the plurality of memory chips of the semiconductor memory device 2100 through the plurality of channels CH1 to CHk.

In FIG. 11, it has been illustrated that a plurality of semiconductor memory chips are coupled to one channel. However, it will be understood that the memory system 2000 may be modified such that only one semiconductor memory chip is coupled to one channel.

Figure 12:
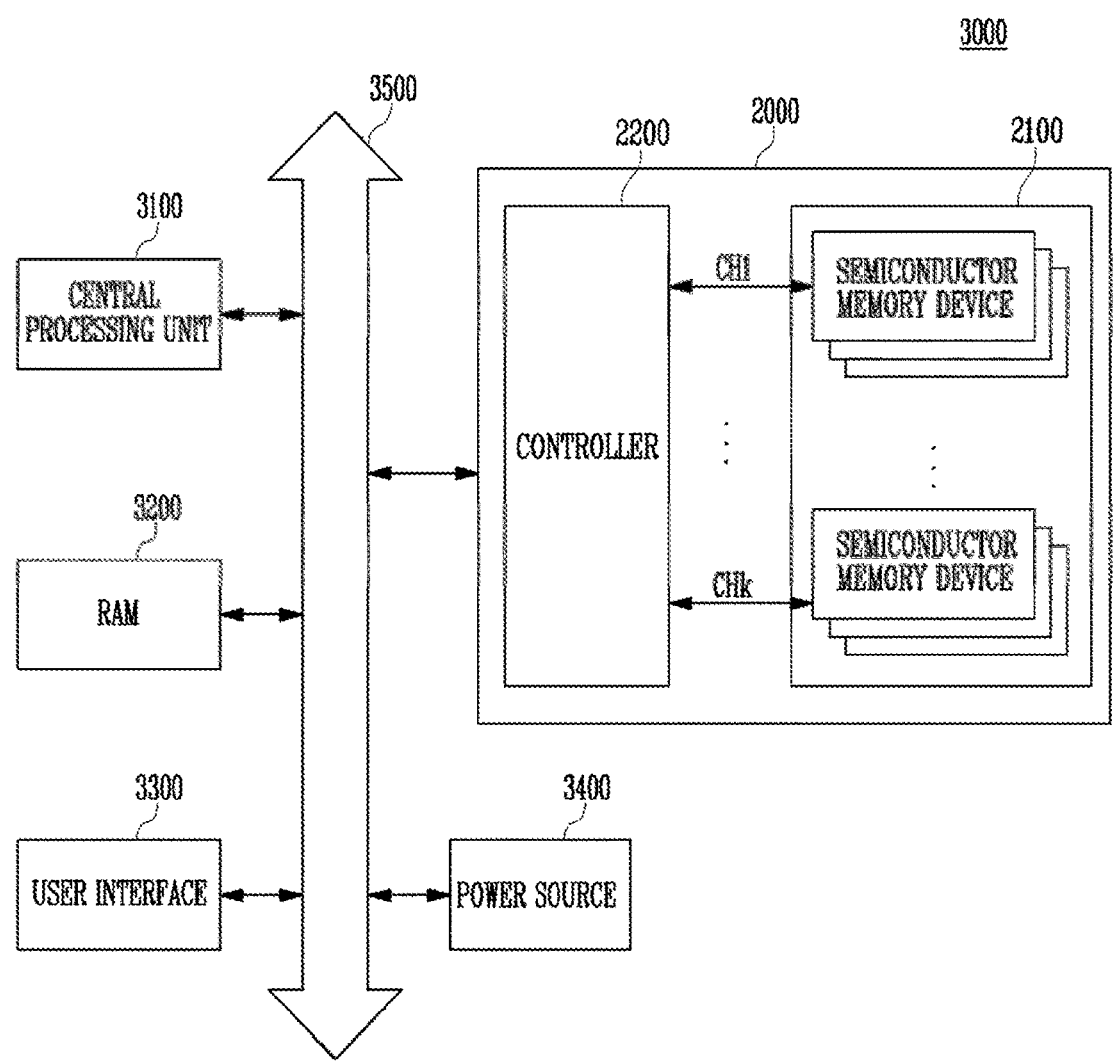
FIG. 12 is a diagram illustrating an example of a computing system including the memory system described with reference to FIG. 11.

FIG. 12 is a diagram illustrating an example of a computing system 3000 including the memory system 2000 described with reference to FIG. 11.

Referring to FIG. 12, the computing system 3000 may include a central processing unit 3100, a RAM 3200, a user interface 3300, a power source 3400, a system bus 3500, and the memory system 2000.

The memory system 2000 may be coupled to the central processing unit 3100, the RAM 3200, the user interface 3300, and the power source 3400 through the system bus 3500. Data supplied through user interface 3300 or data processed by the central processing unit 3100 may be stored in the memory system 2000.

In FIG. 12, it is illustrated that the semiconductor memory device 2100 is coupled to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 12, it is illustrated that the memory system 2000 described with reference to FIG. 11 is provided. However, the memory system 2000 may be replaced by the memory system 1000 described with reference to FIG. 11. In an embodiment, the computing system 3000 may include both the memory systems 1000 and 2000 described with reference to FIGS. 10 and 11.

According to an embodiment of the present disclosure, it is possible to provide a semiconductor memory device having improved reliability and an operating method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a semiconductor memory device including a plurality of cell strings coupled between a bit line and a source line, each cell string including select transistors respectively coupled to select lines and a plurality of memory cells respectively coupled to a plurality of word line, the method comprising:
applying a read voltage to a selected word line to which selected memory cells, among the plurality of memory cells, are coupled and applying a pass voltage to unselected word lines to which unselected memory cells, among the plurality of memory cells, are coupled;
reading data stored in the selected memory cells; and
discharging at least one of the select lines before discharging the selected word line and the unselected word lines.

2. The method of claim 1, wherein discharging at least one of the select lines includes:
applying a ground voltage to at least one of the select lines; and
applying the ground voltage to the selected word line and the unselected word lines after a completion of the discharging of the select lines.

3. The method of claim 2, further comprising, before applying the ground voltage to at least one of the select lines, applying the pass voltage to the selected word line.

4. The method of claim 2, wherein the select lines include a source select line and a drain select line, and applying the ground voltage to at least one of the select lines includes applying the ground voltage to any one of the source select line and the drain select line first.

5. The method of claim 2, wherein applying the ground voltage to the selected word line and the unselected word lines includes sequentially applying the ground voltage to the word lines from a word line farthest from any one of the source line and the bit line.

6. The method of claim 2, wherein applying the ground voltage to the selected word line and the unselected word lines includes dividing the plurality of word lines into at least one word line group and sequentially applying the ground voltage to the at least one word line group from a word line group closest to any one of the source line and the bit line.

7. A method of operating a semiconductor memory device including a plurality of cell strings coupled between a bit line and a source line, each cell string including select transistors respectively coupled to select lines and a plurality of memory cells respectively coupled to a plurality of word line, the method comprising:
applying a pass voltage to a selected word line to which selected memory cells, among the plurality of memory cells, are coupled and to unselected word lines to which unselected memory cells, among the plurality of memory cells, are coupled;
if a first reference time elapses after the pass voltage is applied to the selected word line, discharging the select lines; and
if a second reference time elapses after the select lines are discharged, discharging the selected word line and the unselected word lines.

8. The method of claim 7, wherein the first reference time is a time it takes for a voltage level of the selected word line to reach the pass voltage.

9. The method of claim 7, wherein the second reference time is a time it takes for voltage levels of the select lines to reach a ground voltage.

10. The method of claim 7, wherein the select lines include a source select line and a drain select line, and discharging the selected lines include discharging any one of the source select line and the drain select line first.

11. The method of claim 7, wherein discharging the selected word line and the unselected word lines include sequentially discharging the word lines from a word line farthest from any one of the source line and the bit line.

12. The method of claim 7, wherein discharging the selected word line and the unselected word lines include dividing the plurality of word lines into at least one word line group and sequentially applying the ground voltage to the at least one word line group from a word line group closest to any one of the source line and the bit line.

13. The method of claim 7, wherein the first reference time and the second reference time are stored in a content addressable memory (CAM) area among the plurality of memory cells.

14. A semiconductor memory device comprising:
a memory cell array including a plurality of cell strings coupled between a bit line and a source line, each cell string including select transistors respectively coupled to select lines and a plurality of memory cells respectively coupled to a plurality of word lines; and
a peripheral circuit configured to perform a read operation on selected memory cells among the plurality of memory cells,
wherein the peripheral circuit discharges the select lines before discharging the plurality of word lines in the read operation, and
wherein the peripheral circuit includes:
an address decoder configured to select one of the plurality of word lines in response to an address received from an external controller;
a voltage generator configured to generate voltages to be applied to the select lines and the plurality of word lines in the read operation; and
a control logic configured to control the address decoder and the voltage generator in the read operation.

15. The semiconductor memory device of claim 14, wherein the control logic controls the address decoder and the voltage generator to apply a ground voltage to the select lines and to apply the ground voltage to a selected word line and unselected word lines after the discharging of the select lines is completed.

16. The semiconductor memory device of claim 15, wherein the control logic controls the address decoder and the voltage generator to apply a pass voltage to the plurality of word lines before applying the ground voltage to the select lines.

17. The semiconductor memory device of claim 15, wherein the select lines include a source select line and a drain select line, and the control logic controls the address decoder and the voltage generator to first apply the ground voltage to any one of the source select line and the drain select line.

18. The semiconductor memory device of claim 15, wherein the control logic controls the address decoder and the voltage generator to sequentially apply the ground voltage to the word lines from a word line farthest from any one of the source line and the bit line.

19. The semiconductor memory device of claim 15, wherein the control logic controls the address decoder and the voltage generator to divide the plurality of word lines into at least one word line group and to sequentially apply the ground voltage to the at least one word line group from a word line group closest to any one of the source line and the bit line.

* * * * *

UNITED STATES PATENT AND TRADEMARK OFFICE
CERTIFICATE OF CORRECTION

| | | |
|---|---|---|
| PATENT NO. | : 9,679,660 B1 | Page 1 of 1 |
| APPLICATION NO. | : 15/148123 | |
| DATED | : June 13, 2017 | |
| INVENTOR(S) | : Sung Ho Bae et al. | |

It is certified that error appears in the above-identified patent and that said Letters Patent is hereby corrected as shown below:

On the Title Page

Item (30) Foreign Application Priority Data:
Add -- February 2, 2016 (KR)..........................10-2016-0012998 --

Signed and Sealed this
First Day of August, 2017

Joseph Matal
*Performing the Functions and Duties of the*
*Under Secretary of Commerce for Intellectual Property and*
*Director of the United States Patent and Trademark Office*